United States Patent [19]

Shinada

[11] 4,412,378

[45] Nov. 1, 1983

[54] METHOD FOR MANUFACTURING SEMICONDUCTOR DEVICE UTILIZING SELECTIVE MASKING, ETCHING AND OXIDATION

[75] Inventor: Kazuyoshi Shinada, Yokohama, Japan

[73] Assignee: Tokyo Shibaura Denki Kabushiki Kaisha, Kawasaki, Japan

[21] Appl. No.: 351,251

[22] Filed: Feb. 22, 1982

[30] Foreign Application Priority Data

Feb. 24, 2981 [JP] Japan ................................. 56-25666

[51] Int. Cl.$^3$ .................. H01L 21/302; H01L 21/265
[52] U.S. Cl. .................................. 29/578; 29/576 B; 29/576 E; 29/576 W; 29/580; 148/1.5; 148/175; 148/187; 156/643; 156/648; 156/653; 156/657; 156/659.1; 357/20; 357/34; 357/55; 357/91
[58] Field of Search ............ 29/576 B, 576 E, 576 W, 29/578, 580; 148/1.5, 175, 187; 156/643, 648, 653, 657, 659.1, 662; 357/20, 34, 48–50, 55, 91

[56] References Cited

U.S. PATENT DOCUMENTS

| | | | |
|---|---|---|---|
| 3,761,319 | 9/1973 | Shannon | 148/1.5 |
| 3,943,014 | 3/1976 | Yoshizawa | 148/187 |
| 4,168,999 | 9/1979 | Vora et al. | 148/175 |
| 4,199,380 | 4/1980 | Farrell et al. | 148/1.5 |
| 4,269,636 | 5/1981 | Rivoli et al. | 29/578 X |
| 4,333,774 | 6/1982 | Kamioka | 148/1.5 |

FOREIGN PATENT DOCUMENTS 50-9390 4/1975 Japan .

OTHER PUBLICATIONS

Cosand, A. E., "Very Highspeed Low Power Bipolar . . . Process" International Electron Devices Mtg., 1973 Technical Dig., pp. 35–37.

*Primary Examiner*—W. G. Saba
*Attorney, Agent, or Firm*—Finnegan, Henderson, Farabow, Garrett & Dunner

[57] ABSTRACT

Disclosed is a method for manufacturing a semiconductor device. In this method an oxidation-resistive insulating film is formed on a silicon body of a one conductivity type. A first impurity region of the opposite conductivity type is selectively formed in said semiconductor body before or after said insulating film is formed. Part of said insulating film which corresponds to part of said first impurity region is etched and exposed portions of said silicon body are etched by isotropic etching to a predetermined depth, using said oxidation-resistive insulating film as a mask. An impurity of the opposite conductivity type is doped into said first impurity region, using said insulating film as a mask, so that a second impurity region of the opposite conductivity type whose concentration is higher than a concentration of said first impurity region is formed in said first impurity region and said silicon body. Thermal oxidation is performed using said insulating film as a mask, so that a continuous oxide film is formed to cover exposed portions of said first impurity region, said second impurity region and said semiconductor body. And a third impurity region of the one conductivity type is formed in said first impurity region which is exposed, after part of said insulating film on said first impurity region is etched.

The method of this invention is advantageous for manufacture of a bipolar integrated circuit of high switching operation, high integration density and high reliability.

7 Claims, 12 Drawing Figures

METHOD FOR MANUFACTURING SEMICONDUCTOR DEVICE UTILIZING SELECTIVE MASKING, ETCHING AND OXIDATION

BACKGROUND OF THE INVENTION

The present invention relates to a method for manufacturing a semiconductor device and, more particularly, to a method for manufacturing a bipolar integrated circuit.

Conventionally, an npn bipolar integrated circuit has been manufactured by the following method. An n+-type buried layer 2 is selectively formed in a p-type silicon substrate 1. After an n-type silicon epitaxial layer 3 is formed to cover the p-type silicon substrate 1, a p+-type isolation region 4 is selectively formed to isolate semiconductor elements from each other. The p+-type isolation region 4 reaches the p-type silicon substrate 1. A p-type inner base region 5 and a p+-type outer base region 6 are formed in the silicon epitaxial layer 3 (collector region) of an island shape isolated by the p+-type isolation region 4. An n+-type emitter region 7 and a collector electrode region 8 are formed in the p-type inner base region 5 and the n-type silicon epitaxial layer 3, respectively. Contact holes $10_1$ to $10_3$ are formed at parts of an insulating film 9 corresponding to the p+-type outer base region 6, the n+-type emitter region 7 and the n+-type collector electrode region 8. An aluminum film is deposited on the entire surface of the insulating film 9. Thereafter, the aluminum is patterned to form base, emitter and collector electrodes 11 to 13. Thus, the npn bipolar integrated circuit is manufactured (FIG. 1). In the method for manufacturing the integrated circuit as described above, the p+-type outer base region 6 and the n+-type emitter region 7 are spaced apart by a predetermined length l in order to guarantee the breakdown voltage and to reduce the junction capacitance between the outer base and the emitter. However, when the p+-type outer base region 6 is to be spaced apart from the n+-type emitter region 7, the size becomes larger than the desired size by the length l. In other words, the length of the inner base region 5 becomes greater at the extra portion for mask alignment. Therefore, the resistance of the inner base increases, preventing high speed operation of the npn transistor and decreasing the integration density.

In addition to the bipolar integrated circut wherein the npn transistor is isolated from other circuit elements by the p+-type isolation region 4 formed by isolation diffusion, a bipolar integrated circuit is also known wherein an npn transistor is isolated from other circuit elements by a thick buried oxide film. For example, FIG. 2 shows a transistor of a "walled-emitter" structure which has the n+-type emitter region 7 formed in contact with an isolation oxide film 14. FIG. 2 is a sectional view showing the n+-type emitter region 7 and the isolation oxide film 14 only in the uppermost location. Further, an emitter electrode is omitted. Referring to FIG. 2, reference numeral 5 denotes a p-type inner base layer; 3, an n-type epitaxial layer as a collector region; 2, an n+-type buried layer; and 1, a p−-type silicon substrate. The same reference numerals in FIG. 2 denote the same parts as in FIG. 1. In a method for manufacturing the transistor shown in FIG. 2, the step of etching a relatively thick oxide film (not shown) on the n+-type emitter region 7 is required prior to the formation of the n+-type emitter region 7. In this step, the isolation oxide film 14 in the vicinity of the n+-type emitter region 7 is deeply etched, so that a V-shaped groove 15 is formed. As a result, part of the n+-type emitter region 7 in the vicinity of the isolation oxide film 14 is deeper than remaining area of the n+-type emitter region 7. Therefore, the base width Δw as indicated by the broken line is narrowed, thus lowering the breakdown voltage (VCEO) of the transistor.

SUMMARY OF THE INVENTION

It is an object of the present invention to provide a method for manufacturing a semiconductor device which prevents a decrease in a breakdown voltage between an emitter and a base and prevents a increase in a junction capacitance of the emitter and base, and which accomplishes a high speed operation and high integration density.

In order to achieve the above object of the present invention, there is provided a method for manufacturing a semiconductor device comprising the steps of: forming an oxidation-impermeable insulating film on a semiconductor body of a first conductivity type; selectively forming a first impurity region of a second conductivity type in said semiconductor body before or after said insulating film is formed; etching part of said insulating film which corresponds to part of said first impurity region and etching exposed portions of said semiconductor body by isotropic etching to a predetermined depth, using said insulating film as a mask; doping an impurity of the second conductivity type into said first impurity region, using said insulating film as a mask, so that a second impurity region of the second conductivity type whose concentration is higher than a concentration of said first impurity region is formed in said first impurity region and said semiconductor body; performing thermal oxidation using said insulating film as a mask, so that a continuous oxide film is formed to cover exposed portions of said first impurity region, said second impurity region and said semiconductor body; and forming a third impurity region of the first conductivity type in said first impurity region which is exposed, after part of said insulating film on said first impurity region is etched.

DETAILED DESCRIPTION OF THE PREFERRED EMBODIMENTS

Figure 1:
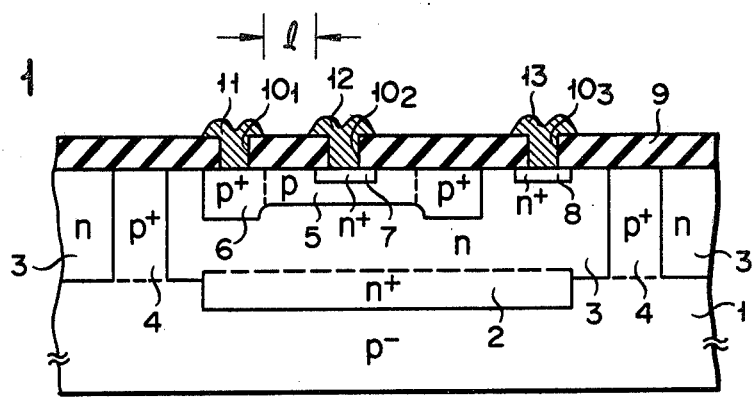
FIG. 1 is a sectional view of a conventional bipolar integrated circuit, an npn transistor of which is isolated by diffusion region from other semiconductor elements.

An oxidation-resistive insulating film in the present invention is used as a mask to etch a semiconductor body, to form a second impurity region of a second conductivity type, and to form an oxide film on the exposed portions of the semiconductor body. Further, the oxidation-resistive insulating film acts as an insulating film for aluminum electrodes. Such an oxidation-resistive insulating film may include a silicon nitride film, an $Al_2O_3$ film and the like. This oxidation-resistive insulating film may be directly formed on the semiconductor body or may be formed on the semiconductor body through a CVD $SiO_2$ film or a thermal oxide film. Especially, when the silicon nitride film is used as the insulating film, the silicon nitride film is preferably formed on the semiconductor body through a thin thermal oxide film in order to avoid the influence of stress.

A first impurity region of a second conductivity type in the present invention may be formed by a method such as a method for thermally diffusing the impurity of the second conductivity type, a method for ion-implanting the impurity described above and subsequently performing annealing and the like. However, after the oxidation-resistive insulating film is formed, the impurity region of the second conductivity type must be formed by ion-implanting the impurity and subsequently performing annealing.

Using the oxidation-resistive insulating film as a mask, the second impurity region of the second conductivity type is formed by a method such as a method for performing thermal diffusion of the impurity of the second conductivity type, a method for ion-implanting the same impurity and subsequently performing annealing, and the like. In order to form the second impurity region of the second conductivity type in the first impurity region and the semiconductor body properly, the concentration of which is higher than that of the first impurity region, the method which combines ion-implantation and annealing is preferred.

Exposed portions of the semiconductor body are etched isotropically in the present invention, in order to form an oxide film in non-exposed portions of the semiconductor body under the oxidation-resistive insulating film in the following selective etching. Then, a margin is formed between openings for the third impurity region which are formed in the following step and the second impurity region of the second conductivity type. The isotropic etching method may include the plasma etching method, a method for using a wet etchant consisting of a mixture solution of KOH and a surface active agent, and so on. The formation of the oxide film improves the junction breakdown voltage of the second impurity region of the second conductivity type and the third impurity region of the first conductivity type. Moreover, a desired breakdown voltage is obtained by adjusting the etching depth by isotropic etching.

A case will be described with reference to FIGS. 3A to 3G wherein the present invention is applied to the manufacture of an npn bipolar integrated circuit.

Figure 3A:
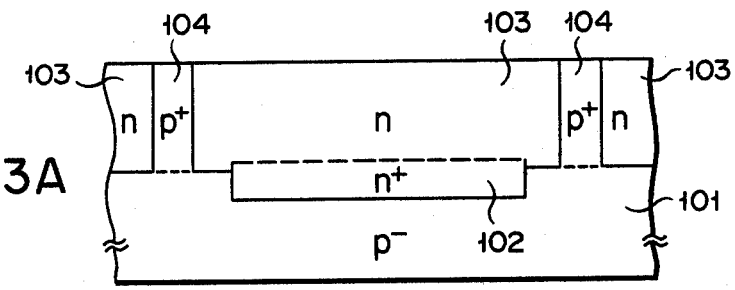
FIGS. 3A to 3G are sectional views for explaining the steps of manufacturing a bipolar integrated circuit which has an npn transistor isolated by diffusion region from other semiconductor elements according to the present invention.

EXAMPLE (i) Sb was selectively diffused into a $p^-$-type silicon substrate 101 of 18 to 25 $\Omega$·cm to form an $n^+$-type buried layer 102, the sheet resistivity of which was $\rho s = 20$ to 30 $\Omega/\square$. Further, an n-type silicon epitaxial layer (collector region) 103 of 0.2 $\Omega$·cm resistivity and 2.0 $\mu$m thick was grown on the $p^-$-type silicon substrate 101. A $p^+$-type isolation region 104 was then formed in accordance with the conventional method to isolate an npn transistor from other semiconductor elements (FIG. 3A).

Figure 3B:
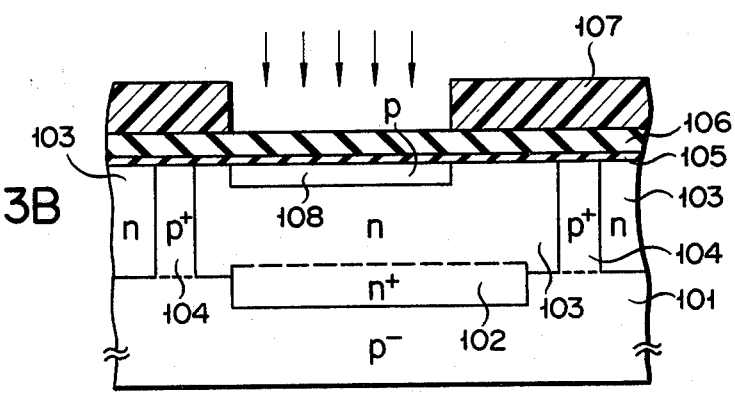

(ii) Annealing was performed in a dry oxygen atmosphere at a temperature of 900° C. for 20 minutes to form a thin thermal oxide film 105 of 100 Å to cover the entire surface of the silicon epitaxial layer. A silicon nitride film 106 of 1,000 Å thick was deposited by the reduced-pressure CVD method on the thermal oxide film 105. Subsequently, a resist pattern 107 which had an opening corresponding to a prospective area of an inner base region was formed by the photoetching method on the silicon nitride film 106. Boron was ion-implanted at energy of 90 keV with dose of $2.5 \times 10^{13}/cm^2$ into the n-type silicon epitaxial layer 103 of an island isolated by the $p^{30}$-type region 104 through the silicon nitride film 106 and the thermal oxide film 105, using the resist pattern 107 as a mask. The resist pattern 107 was then removed. A p-type inner base region 108 (first impurity region) whose sheet resistance $\rho s$ was 1,000 $\Omega/\square$ was formed by performing annealing in a nitrogen atmosphere at a temperature of 1,000° C. for 60 minutes (FIG. 3B).

Figure 3C:
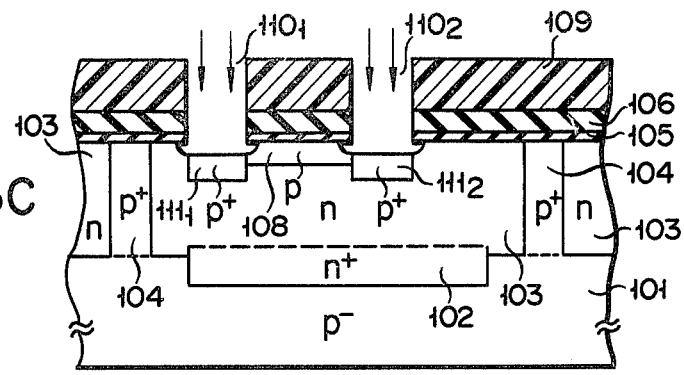

(iii) A resist pattern 109 which had an opening corresponding to a prospective area of an outer base region was formed on the silicon nitride film 106 by the photoetching method. Using the resist pattern 109 as a mask, the silicon nitride film 106 was selectively etched in a plasma of $CF_4$, $O_2$ and $N_2$. The thermal oxide film 105 under the silicon nitride film 106 was etched by a wet etchant of $NH_4F$ so as to form openings $110_1$ and $110_2$ near the both ends of the inner base region 108. The n-type silicon epitaxial layer 103 was etched to a thickness of 0.3 $\mu$m in a plasma of $CF_4$ and $O_2$, using the resist pattern 109 as a mask. By this isotropic etching, the n-type silicon epitaxial layer 103 was etched by 0.3 $\mu$m in the transverse direction at the part under the remaining thermal oxide film 105. Boron was ion-implanted with dose of $1.2 \times 10^{15}/cm^2$ at energy of 70 keV into the exposed portions of the n-type silicon epitaxial layer 103 (inner base region), using the resist pattern 109 as a mask. The resist pattern 109 was then removed. Annealing was performed in a nitrogen atmosphere at a temperature of 1,000° C. for 30 minutes to form $p^+$-type outer base regions (second impurity regions) $111_1$ and $111_2$ (FIG. 3C). The boron ion progresses only directly, so that boron is not doped into the n-type silicon epitaxial layer 103 under the thermal oxide film 105.

Figure 3D:
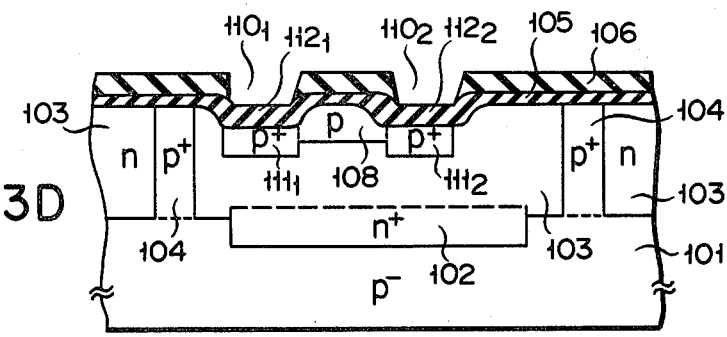

(iv) Annealing was then performed in a wet oxygen atmosphere at a temperature of 1,000° C. for 43 minutes, using the silicon nitride film 106 as a mask. At this time, as the n-type silicon epitaxial layer 103 was etched by isotropic etching, the exposed portions of the n-type silicon epitaxial layer 103 under the silicon nitride film 106 were also oxidized and, oxide films $112_1$ and $112_1$ of 3,000 Å thick were formed as shown in FIG. 3D.

(v) A resist pattern 113 which had openings corresponding to prospective areas of the emitter region between the $P^+$-type external base regions $111_1$, $111_2$ and of the collector electrode, was formed. Using the resist pattern 113 as a mask, the exposed portions of the silicon nitride film 106 were selectively etched in a plasma of $CF_4$, $O_2$ and $N_2$. Further, the exposed portions of the thin thermal oxide film 105 were etched by wet etching using $NH_4F$. As a result, as shown in FIG.

3E, an opening 114 for the emitter region was formed in self-alignment with the p+-type external base regions 111₁, 111₂. At the same time, an opening 115 for the collector electrode was formed on part of the n-type silicon epitaxial layer (collector region) 103. The resist pattern 113 was then removed. Arsenic was ion-implanted with a dose of 1×10¹⁶ /cm² at energy of 50 keV using the silicon nitride film 106 and the oxide films 112₁ and 112₂ as masks. Annealing was then performed in a nitrogen atmosphere at a temperature of 1,000° C. for 40 minutes to form an n+-type emitter region (third impurity region) 116 and an n+-type collector electrode region 117. These regions had a sheet resistance ρs of 30 Ω/□ and a junction depth xj of 0.3 μm (FIG. 3F). Finally, the base width of the p-type inner base region 108 of xj=0.6 μm and ρs=1,000 Ω/□ was formed and the base width became 0.3 μm. The p+-type outer base regions 111₁ and 111₂ had xj of 0.5 μm and ρs of 100 Ω/□.

(vi) In accordance with the conventional method, the oxide films 112₁ and 112₂ were selectively etched to form contact holes 118₁ and 118₂. An Al-Si film was deposited to a thickness of 1 μm and patterned to form an emitter electrode 119, base electrodes 120₁ and 120₂ and a collector electrode 121. Thus, the npn bipolar integrated circuit was manufactured (FIG. 3G).

Figure 3E:
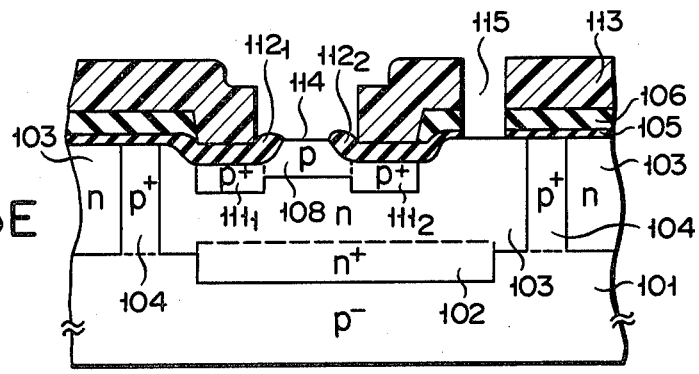
Figure 3F:
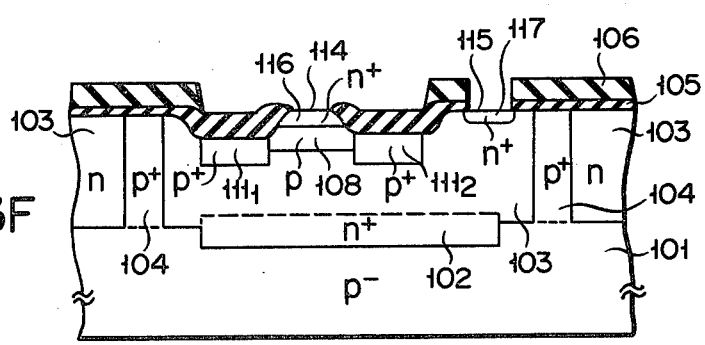
Figure 3G:
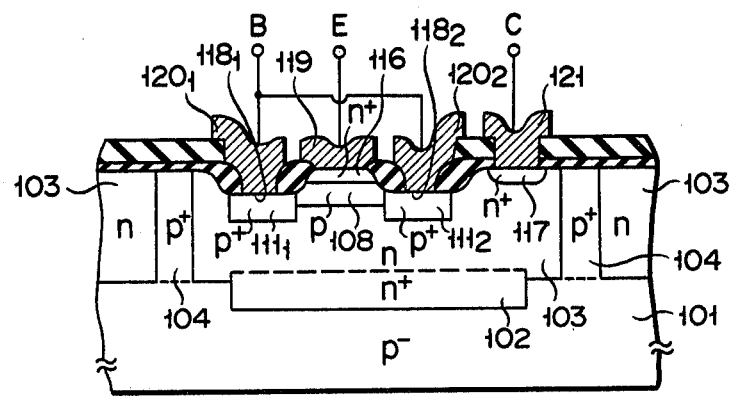

According to the present invention, as shown in FIG. 3E, an opening 114 for the emitter region is formed in self-alignment with the p+-type external base regions 111₁ and 111₂. Without performing the mask alignment, arsenic is ion-implanted through the opening 114 and annealing is performed, so that the n+-type emitter region 116 is properly spaced apart from the p+-type base regions 111₁ and 111₂. Therefore, the thick oxide films 112₁ and 112₂ may prevent the decrease of the junction breakdown voltage of the emitter and the base and the increase of the junction capacitance of the emitter and the base owing to an insufficient length of a region between the p+-type external base regions 111₁ and 111₂ and the n+-type emitter region 116. As described above, since the emitter region 116 can be formed in a self-aligned manner, the series resistance of the inner base can be lowered, thus allowing manufacture of the npn bipolar integrated circuit of high switching speed and high integration density.

Figure 4:
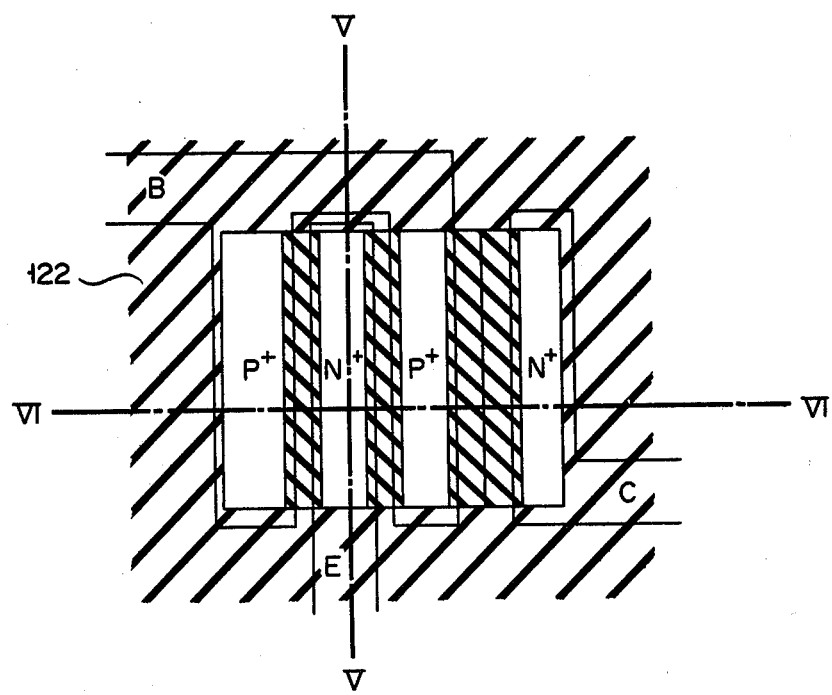
FIG. 4 is a plan view of the bipolar integrated circuit which has a transistor of the walled-emitter structure manufactured according to a method of the present invention.
Figure 5:
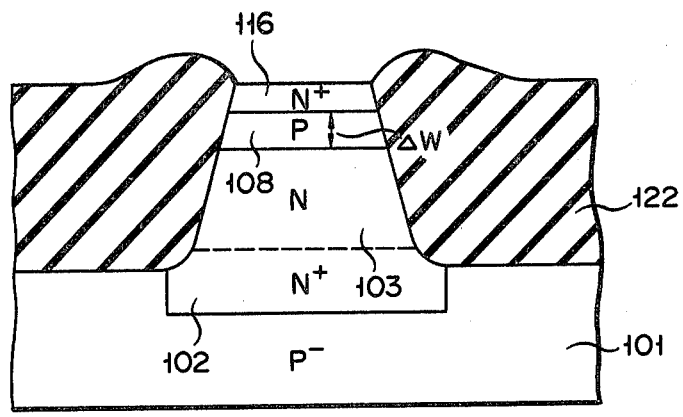
FIG. 5 is a sectional view along the line V—V of FIG. 4.
Figure 6:
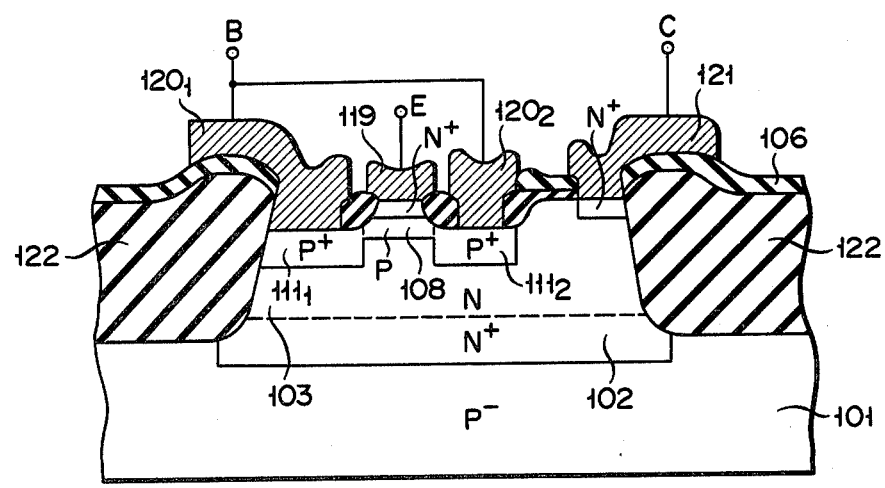
FIG. 6 is a sectional view along the line VI—VI of FIG. 4.

FIG. 4 is a plan view of a bipolar integrated circuit according to another embodiment of the present invention. FIG. 5 is a sectional view along the line V—V of FIG. 4. FIG. 6 is a sectional view along the line VI—VI of FIG. 4. As is apparent from FIG. 5, this bipolar integrated circuit has a transistor of a walled-emitter structure. The same reference numerals in FIGS. 4 to 6 denote the same parts in FIG. 3. The emitter electrode 119 is omitted in FIG. 5. As is apparent from the comparison of FIG. 6 and FIG. 3G, the bipolar transistors are manufactured substantially in the same manner except that a procedure for isolating the transistor from other circuit elements is different.

Figure 2:
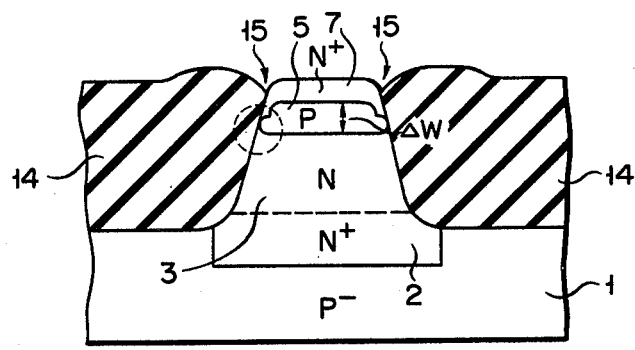
FIG. 2 is a sectional view of a conventional bipolar integrated circuit which has an npn transistor of a walled-emitter structure.

The n+-type emitter region 116 in FIGS. 5 and 6 is formed after the thin thermal oxide film 105 on the inner base region 108 is etched, in the same manner as shown in FIGS. 3D to 3F. Referring to FIG. 5, the thick isolation oxide film 122 is substantially kept to be in the original shape. The problem of narrowing of the base width Δw in the vicinity of the isolation oxide film 14 as shown in FIG. 2, that is, the drawback of the conventional walled-emitter type transistor is solved. Therefore, the transistor of high reliability is manufactured.

As described in detail above, according to the present invention, the relatively thick oxide film is formed between the emitter region and the outer base region of the npn transistor. Further, the emitter region is formed through the opening which is self-aligned with the external base region. Thus, the decrease of the junction breakdown voltage of the emitter and the base and the increase of the junction capacitance of the emitter and base are prevented. Further, the distance between the emitter and the outer base region is minimized. In this manner, the present invention provides a method for manufacturing the semiconductor such as the bipolar integrated circuit of the high switching operation and the high integration density.

What is claimed is:

1. A method for manufacturing a semiconductor device comprising the steps of: forming an oxidation resistive insulating film on a semiconductor body of a first conductivity type; selectively forming a first impurity region of a second conductivity type in said semiconductor body before or after said insulating film is formed; etching part of said insulating film which corresponds to part of said first impurity region and isotropically etching exposed portions of said semiconductor body to a predetermined depth, using said insulating film as a mask; doping an impurity of the second conductivity type into said first impurity region, using said insulating film as a mask, so that a second impurity region of the second conductivity type whose concentration is higher than a concentration of said first impurity region is formed in said first impurity region and said semiconductor body; performing thermal oxidation using said insulating film as a mask, so that an oxide film is formed to cover exposed portions of said first impurity region, said second impurity region and said semiconductor body; and forming a third impurity region of the first conductivity type in said first impurity region which is exposed, after part of said insulating film on said first impurity region is etched.

2. A method according to claim 1, wherein said insulating film is formed on an oxide film which is formed on the surface of said semiconductor body.

3. A method according to claim 1, wherein the isotropic etching of the surface of the semiconductor body is performed by plasma etching.

4. A method according to claim 1, wherein said second impurity region is formed by ion-implantation and annealing thereafter.

5. A method according to claim 1, wherein said semiconductor body is separated from other circuit elements by a p-n junction.

6. A method according to claim 1, wherein said semiconductor body is separated from other circuit elements by a buried oxide film.

7. A method according to claim 1, wherein said third impurity region is surrounded by said second impurity region.

* * * * *